Figure 4A:
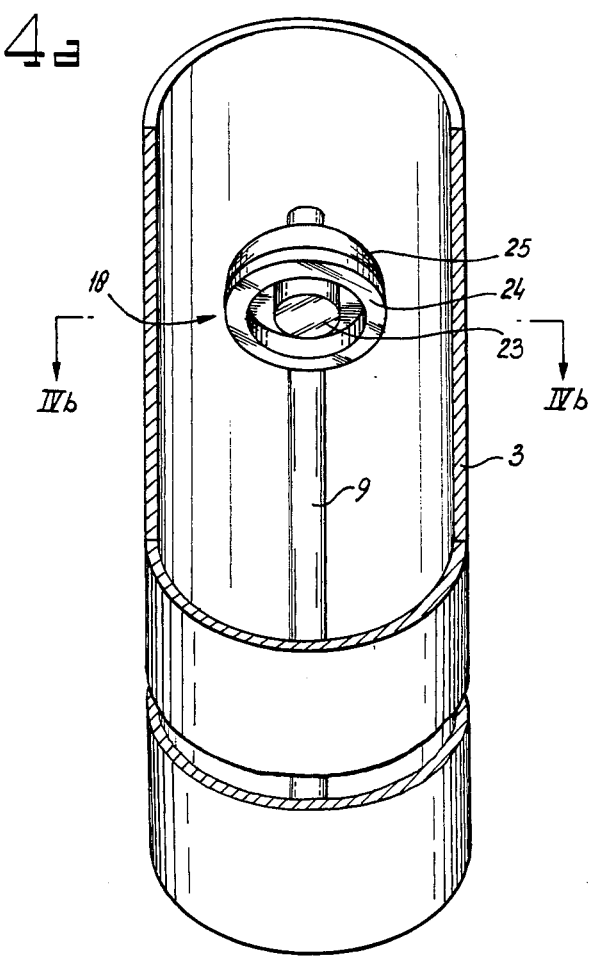

United States Patent [19]

Veltrop et al.

[11] Patent Number: 4,849,088

[45] Date of Patent: Jul. 18, 1989

[54] CATHODE ARC DISCHARGE EVAPORATING DEVICE

[75] Inventors: Hans Veltrop, Grubbenvorst; Harald Wesemeyer, Wiehl; Boudewijn J. A. M. Buil, Belfeld, all of Netherlands

[73] Assignee: Hauzer Holding B.V., Pa Venlo, Netherlands

[21] Appl. No.: 167,408

[22] Filed: Mar. 14, 1988

[30] Foreign Application Priority Data

Mar. 16, 1987 [NL] Netherlands ..................... 8700620

[51] Int. Cl.$^4$ ................... C23C 14/28; C23C 14/32
[52] U.S. Cl. ................... 204/298; 204/192.38; 427/37
[58] Field of Search ........... 204/192.38, 298 D; 427/37, 47; 118/50.1

[56] References Cited

U.S. PATENT DOCUMENTS

| | | | |
|---|---|---|---|
| 4,221,652 | 9/1980 | Kuriyama | 204/298 |
| 4,492,845 | 1/1985 | Kljuchko et al. | 219/121 P |
| 4,673,477 | 6/1987 | Ramalingam et al. | 204/192.38 |

OTHER PUBLICATIONS

Journal of Vacuum Science & Technology/A. vol. 4, No. 3, part 1, May-Jun. 1986, pp. 388–392, American Vacuum Society, Woodbury, N.Y., U.S.A.
M. Wright et al.: "Design Advances and Applications of the Rotatable Cylindrical Magnetron".
Instruments and Experimental Techniques, vol. 19, #4, part 2, Jul./Aug. 1976, pp. 1211–1213.

Primary Examiner—Aaron Weisstuch
Attorney, Agent, or Firm—Harness, Dickey & Pierce

[57] ABSTRACT

Cathode arc discharge evaporating device having a body of revolution as cathode. The target surface is arranged at the outside surface of the body of revolution. To control movement of the arc spot a magnetic field generating device is provided inside the body of revolution, which may be moveable with respect to the cathode.

6 Claims, 3 Drawing Sheets

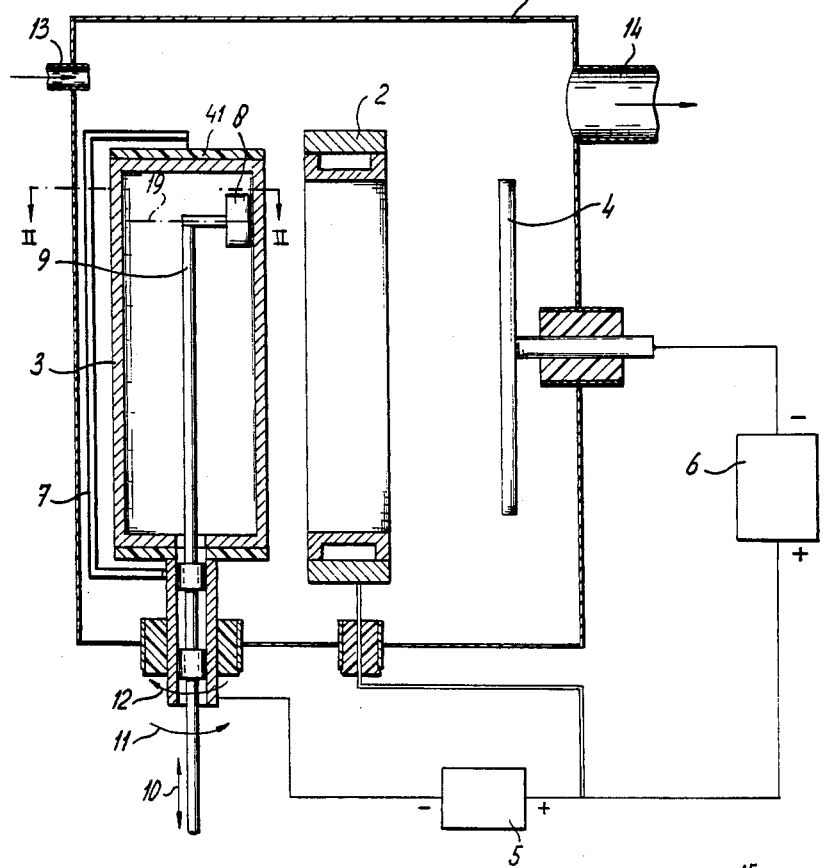
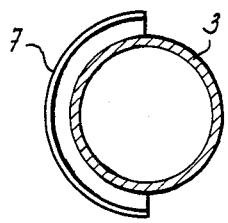
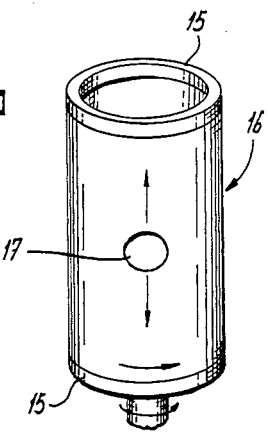

CATHODE ARC DISCHARGE EVAPORATING DEVICE

The present invention relates to a cathode arc discharge evaporating device, comprising a target surface of the material to be evaporated, embodied as a surface of a hollow body of revolution and provided with at least one arc controlling magnetic field generating device.

Such a device is known from GB-A-2127043. In this specification, a cylindrical consumable cathode having a surface made of the material to be deposited is described into which a work piece is introduced. The housing of this device is connected as an anode. Around the housing of this device a magnetic coil is provided. This coil primarily functions to control the flow of material from the target surface of the substrate. However, it also has some effect on the position of the spot of the arc drawn between anode and cathode on the target surface. Control of the position of this spot is very important because it is generally desired to consume the target surface as evenly as possible. To realize this object, it is necessary that the arc spot runs along the defined path along the target surface and that each point of that target surface is touched the same number of times by the arc spot. Because the distance of the magnetic field generating device to the target surface according to this specification is quite considerable it is not possible to obtain precise control of the path of the arc on the target surface. From the description it is also clear that it is not the object to do so.

The invention aims to obviate these drawbacks and to obtain a cathode surface without an erosion relief that has trenches or canyons. This object is realized in that said magnetic field generating device is provided internally of the body of revolution and in that the outer surface of the body of revolution comprises the evaporation surface. By introducing the magnetic field generating device inside of the body of revolution, constituting the evaporation surface, it is possible to obtain a precisely controlled movement of the arc spot along the evaporation surface. This is because the distance from the magnetic field generating device and the arc spot is considerably reduced with regard to the device according to the British specification.

The magnetic field generating device can comprise an assembly of permanent magnets as well as an assembly of electro magnets or a combination thereof.

If it is intended that the spot is only within a restricted area of the evaporation surface, screen means can be provided. By means the body of revolution with regard to the screen means it is possible to provide a fresh target surface. This embodiment is important if the work piece extends only on one side of the body of revolution.

According to a further preferred embodiment, means are provided to rotate the body of revolution with respect to the magnetic field generating device and/or screen means. By this a target surface can be evenly used.

It is of course also possible to translate the body of revolution with respect to the magnetic field generating device and/or screen means. Combinations of both rotational and translational movement are also envisaged by this invention.

It is also possible to rotate the magnetic field generating device substantially perpendicular to the axis of the body of revolution. If this magnetic field generating deivce is an electro magnetic coil, rotating has to be understood in an electromagnetic sense. The expression "with respect to" has to be understood that it is possible to move either component, the other component being fixed or that both components move in the same sense with a different speed or in a different sense with the same or different speed.

Figure 4B:
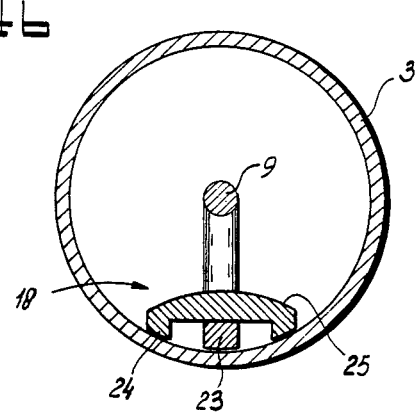
Figure 5:
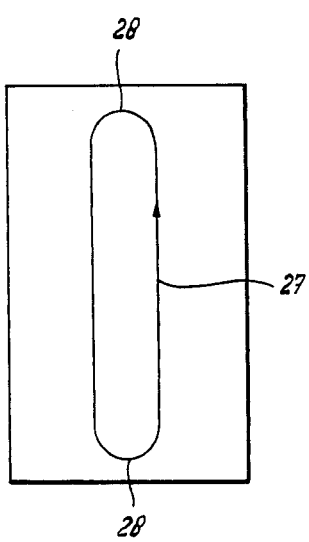
Figure 6:
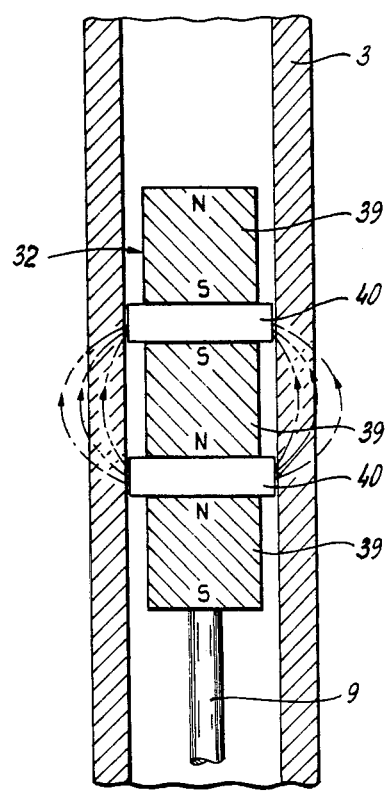

The invention will be further elucidated by way of example with reference to the accompanying drawings, in which:

FIG. 1 is a partially cross-sectioned side elevation of the device according to the invention, FIG. 2 is a cross-section of the cathode arrangement according to FIG. 1 along line II—II, FIG. 3 is a side elevation of a cathode arrangement which can be used in a device according to FIG. 1, FIGS. 4a and 4b are respectively an exploded elevational view and a cross-sectional view along line IVb—IVb of the arrangement of a hollow cylinder in which a magnetic field generating device is introduced, FIG. 5 is a projection of the path of movement of the arc in a stationary magnetic field generating device, and FIG. 6 is a further embodiment of a magnetic field generating device arranged in a cathode formed as a hollow cylinder.

In FIG. 1 a cathode/anode arc discharge device is shown comprising a housing 1 in which an anode ring 2 and a cathode cylinder 3 are provided. The anode ring 2 can be cooled by means such as is known in the art. Furthermore, a substrate holder 4 is provided. Anode ring 2 and cathode cylinder 3 are connected to arc dc supply 5. The voltage of substrate holder 4 is kept between 0 and some negative K volts by high voltage supply 6. Cathode cylinder 3 is partially surrounded by insulation 41 and double dark screen shielding 7. This is also clear from FIG. 2. In cathode cylinder 3 a magnetic field generating device 8 is provided suspended to a rod 9. As is schematically shown by arrow 10, rod 9 can be moved up and down by means not shown. With arrow 11 it is indicated that it can also rotate. From arrow 12 it is clear that cathode cylinder 3 itself can be rotated by means not shown but being known in the art. Housing 1 is provided with an inlet 13 for introducing of gas and an outlet 14 to which a pump, not shown, can be connected to evacuate housing 1.

The device according to FIG. 1 functions as follows. When arc supply 5 is switched on an arc is ignited and maintained between anode ring 2 and cathode cylinder 3. At the spot where this arc touches cathode cylinder 3 the cathode material from which the cathode cylinder 3 is made generates a flow of atoms and ions to substrate holder 4. By imposing a negative voltage on the substrate holder 4 an optimised deposition of this material is obtained. Normally the cathode spot will travel randomly over the cathode cylinder. This means that from the cathode surface, macro particles and droplets will be emitted and an uneven erosion will happen. To prevent this, magnetic field generating device 8 is provided. The cathode spot will be attracted to and controlled by the magnetic field generated by this device 8. To evenly consume the cathode cylinder 3, it is possible to move magnetic field generating device 8 by rod 9 relative to cathode cylinder 3 as indicated by arrows 10. It is also possible to rotate rod 9 by which the magnetic field generating device 8 is moved along the surface of the cathode cylinder 3. This is also shown in FIGS. 4a and 4b. If one wishes the cathode arc spot will only travel on that side of the cathode which faces the substrate, so the cathode material evaporates in the direction of the substrate holder 4, a double dark screen shielding is provided. By this the spot will only move along the exposed surface of cathode cylinder 3. To evenly consume the cathode cylinder 3 in this case, cylinder 3 can be rotated as indicated by arrow 12. During operation of the device housing 1 is evacuated by discharging of gasses through outlet 14. During igniting of the arc, gas can be supplied through inlet 13.

In FIG. 3 another embodiment of the cathode cylinder indicated as 16 is shown. In this embodiment, as means for preventing the arc to wander from the cathode surface, two rings of ceramic insulation 15 are provided. In FIG. 3 the arc spot trajectory 17 is also indicated which will be followed if cathode cylinder 3 and magnetic field generating device 8 as shown in FIG. 1 are fixed relative to each other. To prevent localized erosion during operation of the device, cathode 16 and magnetic field generating device 18 are moved with respect to each other as indicated by arrows in FIG. 3. In FIG. 4b a cross-section of the cathodic cylinder 3 according to FIG. 1 is shown having a specific embodiment of the magnetic field generating device indicated by reference numeral 18. Device 18 comprises a permanent magnet assembly having a central pole 23 surrounded by soft iron magnetic conductor portions 25 and 25 with opposite polarity to pole 23.

Although in this embodiment the magnetic field generating device is a permanent magnet assembly, the magnetic field generating device according to FIG. 1 can also comprise a coil assembly, in which case electrical supply leads have to be provided through rod 9. It is also possible to rotate this magnetic field generating device around axis 19 as shown in FIG. 1 by mechanical and/or electrical means known in the art.

FIG. 5 shows a projection of the surface of the cathodic cylinder 3. The arc trajectory is indicated by reference numeral 27. To obtain this trajectory, a magnetic field generating assembly as shown in FIG. 4a can be used having an elongated shape. To obtain trajectory 27 the magnetic field generating device can be fixed with regard to the cathode cylinder. When the cathode cylinder is rotated with regard to the magnetic field generating device the vertical portion of trajectory 27 will constantly change whilst the upper and lower portions of this trajectory in FIG. 5 indicated by reference numeral 28 remain the same. To prevent erosion near 28 the speed of movement of the arc has to be increased. The speed of the arc spot with respect to the cathode cylinder can be described by a sinusoidal function. In addition, an electrical modulation by means of coils can be supplied to the arc track to avoid erosion at places such as 28.

In FIG. 6 a further embodiment is shown in which the magnetic field generating device 32 comprises an assembly of permanent magnets 39. Between these magnets 39 soft iron parts 40 are provided. Device 32 can be moved upward and downward by rod 9 with respect to cathode 3. In this embodiment the arc spot will be at those points in which the components of the magnetic field perpendicular to the cathode surface are zero and where the parallel components are at maximum.

In this embodiment it is not necessary to rotate rod 9 because the arc spot rotates on the lateral surface of the cathode. A helical path of the arc trajectory is obtained when rod 9 is moved.

Although preference is given to the embodiments described, it has to be understood that many modifications are possible. When using electro magnetic coils as the magnetic field generating device it is possible to provide a modulating magnetic field. Furthermore, it is possible to use all magnetic field generating devices known in the prior art.

We claim:

1. Cathode arc evaporating device, comprising an evaporation surface of the material to be evaporated formed as a surface of a hollow body of revolution, means for supporting said evaporation surface for rotation about an axis, and at least one arc spot steering magnetic field generating device supported within said evaporation surface for movement in a direction parallel to the axis of rotation of said evaporation surface for avoiding non-uniform erosion of said evaporation surface.

2. Device according to claim 1, wherein the magnetic field generating device comprises an assembly of permanent magnets.

3. Device according to claim 1, wherein the magnetic field generating device comprises an assembly of electro magnets.

4. Device according to claim 1, wherein dark screen means are provided on one side of the evaporation surface.

5. Device according to claim 1, wherein means are provided to translate the body of revolution with regard to the magnetic field generating device.

6. Device according to claim 1, wherein the magnetic field generating device is rotatable in a plane substantially perpendicular to the rotational axis of the body of revolution.

* * * * *